United States Patent [19]
Gronet et al.

[11] Patent Number: 6,159,866
[45] Date of Patent: Dec. 12, 2000

[54] METHOD FOR INSITU VAPOR GENERATION FOR FORMING AN OXIDE ON A SUBSTRATE

[75] Inventors: Christian M. Gronet, Portola Valley; Peter A. Knoot, San Carlos; Gary E. Miner, Newark; Guangcai Xing, Fremont; David R. Lopes, Sunnyvale; Satheesh Kuppurao, Santa Clara, all of Calif.

[73] Assignee: Applied Materials, Inc., Santa Clara, Calif.

[21] Appl. No.: 09/507,946

[22] Filed: Feb. 22, 2000

Related U.S. Application Data

[62] Division of application No. 09/033,391, Mar. 2, 1998, Pat. No. 6,037,273.

[51] Int. Cl.$^7$ .................................................. H01L 21/31
[52] U.S. Cl. ............................................................ 438/769
[58] Field of Search ...................................... 438/769, 770, 438/773, 787

[56] References Cited

U.S. PATENT DOCUMENTS

Re. 36,290  9/1999  Clark et al. .
4,139,658   2/1979  Cohen et al. .

(List continued on next page.)

OTHER PUBLICATIONS

"Dependence of Partial Pressure of H2) on Pyrogenic Growth of Silicon Dioxide", A.N. Chandorkar Dept. of Electrical Engineering415–417.

Technical Notes "Formation of 20–25A Thermal Oxide Films on Silicon at 950–1140C" J.A. Aboaf 1046 Journal of the Electrochemical Society vol. 118, No. 8.

"A New Method for Obtaining A Clean SiO2–Si Interface Using NH3–O2 Oxidation", Yen–Chuan Tseng and Katsufusa Shono 362 Japanese Journal of Applied Physics/Part 2 Feb. 29, 1989 No. 2.

Enomoto et al Thermal Oxidation Rate of a Si3N4 film and its masking effect against oxidation of silicon, Japanese Journal of Applied Physics, vol. 17, No. 6 (1978) pp. 1049–1058.

Deal Thermal Oxidation Kinetics of Silicon in Pyrogenic H2O and 5% HCi/HO mixtures, Journal of Electrochemical Society: Solid–State Science and Tech., vol. 125, No. 4 (1978) pp. 576–579.

Copy of PCT Search Report PCT/US 98/11577.

Tsubouchi et al. "Oxidation of Silicon in High–Pressure Steam," Japanese Journal of Applied Physics, vol. 16, No. 5 (1977) p.855–856.

Formation Process of Highly Reliable Ultra–Thin Gate Oxide, Kazuyuki OHMI Toshiyauki Iwamoto, Tatuhiro Yabune, Tohiki Miyake and Tadahiro OHMI Appl. Phys. vol. 35 (1996) pp. 1531–1534 Part 1, No.2B.

Preoxide–Controlled Oxidation for Very THin Oxide Films; Laboratory for Microelectronics, Research Institute of Electrical communication, Tohoku University, 2–1–1–Katahira, Aobu–ku, Sendal (Received Sep. 14, 1992; accepted for publication Nov. 21, 1992.

Very thin Oxide Film on a silicon surface by Ultraclean Oxidation, Dept of Electronic Engineerign, Faculty of Engineering, Tohoku University Sendai 980, Japan: 1992 American Institute of Physics.

SM Sze VLSI Technology pp. 64–70, 115–121.

Stanely Wolf and Richard N. Tauber, Silicon Processing for the VLSI Era, vol. 1 P16, 209–217.

*Primary Examiner*—Charles Bowers
*Assistant Examiner*—Keith Christianson
*Attorney, Agent, or Firm*—Blakely Sokoloff Taylor & Zafman

[57] ABSTRACT

A method of forming an oxide on a substrate. According to the method of the present invention a substrate is placed in a chamber. An oxygen containing gas and a hydrogen containing gas are then fed into the chamber. The oxygen containing gas and the hydrogen containing gas are then caused to react with one another to form water vapor in the chamber. The water vapor then oxidizes the substrate.

4 Claims, 8 Drawing Sheets

U.S. PATENT DOCUMENTS

| | | |
|---|---|---|
| 4,214,919 | 7/1980 | Young . |
| 4,268,538 | 5/1981 | Toole et al. .............................. 438/770 |
| 4,818,327 | 4/1989 | Davis . |
| 4,906,595 | 3/1990 | Van Der Plas et al. . |
| 5,242,468 | 9/1993 | Clark et al. . |
| 5,294,571 | 3/1994 | Fujishiro et al. . |
| 5,618,349 | 4/1997 | Yuuki . |
| 5,631,199 | 5/1997 | Park . |
| 5,633,212 | 5/1997 | Yuuki . |
| 5,693,578 | 12/1997 | Nakanishi et al. . |
| 5,777,300 | 7/1998 | Kobayashi et al. . |
| 5,851,892 | 12/1998 | Lojek et al. . |

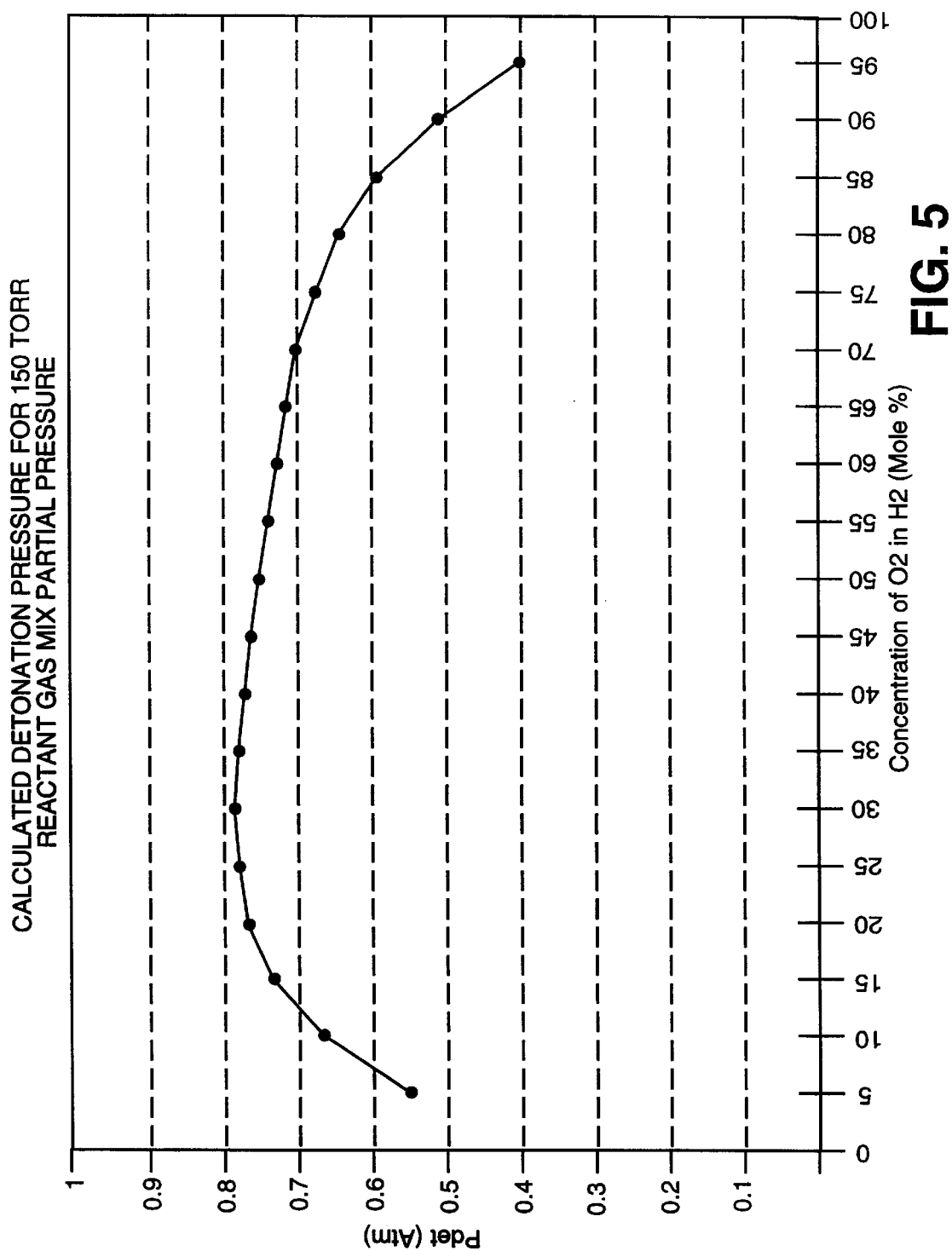

METHOD FOR INSITU VAPOR GENERATION FOR FORMING AN OXIDE ON A SUBSTRATE

The present application is a division of Ser. No. 09/033,391 filed Mar. 2, 1998, now U.S. Pat. No. 6,037,273, which is a Continuation-in-Part of prior U.S. patent application Ser. No. 08/893,774, filed Jul. 11, 1997 and assigned to the present Assignee.

BACKGROUND OF THE INVENTION

1. Field of the Invention

The present invention relates to the field of steam oxidation and more specifically to a method and apparatus for insitu moisture generation in a rapid thermal steam oxidation process.

2. Discussion of Related Art

In the fabrication of modern integrated circuits, such as microprocessors and memories, oxidation processes are used to passivate or oxidize silicon films. A popular method to oxidize silicon surfaces and films such as polysilicon gate electrodes and substrates is to use a steam ($H_2O$) oxidation process. In such cases water vapor ($H_2O$) is brought into an oxidation chamber to react with the silicon surfaces to form silicon dioxide.

Present steam oxidation processes generally take place in multi-wafer resistively heated "hot wall" furnaces. Present steam oxidation processes typically use a pyrogenic torch or bubbler located outside of the reaction chamber in which the steam oxidation process is to take place. In the case of a pyrogenic torch, a hydrogen containing gas and an oxygen containing gas are ignited by a flame in a reaction area at atmospheric pressure and located away from and generally in a different chamber than the chamber in which wafers are placed. The flame ignition occurs at atmospheric pressure. A problem associated with pyrogenic torch methods, is that for safety reasons only certain concentration ratios of hydrogen containing gas and oxygen containing gas can be utilized. Limiting the available gas ratio unduly restricts ones ability to generate ambients with desired concentrations of $H_2O/H_2$ or $H_2O/O_2$. For example, in order to keep a stable flame burning, torch methods typically require $H_2:O_2$ ratios of more that 0.5:1 and less than 1.8:1, respectively. Bubblers are also undesirable for moisture generation in that they can be a significant source of contamination and because they cannot accurately and reliably control the amount of moisture generated.

Another problem associated with the use of pyrogenic torches and bubblers is that these methods are not easily implemented into modern rapid thermal heating apparatuses which utilize light sources for rapid temperature ramps and reaction times measured in terms of seconds as opposed to minutes and hours. Rapid thermal heaters are preferred over resistively heated furnaces because of their excellent temperature uniformity and control provides more for uniform processing and because their short reaction times reduce the thermal budget of fabricated devices.

Thus, what is desired is a method and apparatus for generating moisture in a rapid thermal heating apparatus which does not suffer from contamination and safety issues and which can use a full spectrum of gas mixtures as well as concentration ratios.

SUMMARY OF THE INVENTION

A method of forming an oxide on a substrate is described. According to the present invention a substrate is placed in a reaction chamber. An oxygen containing gas and a hydrogen containing gas are then fed into the chamber. The oxygen containing gas and the hydrogen containing gas are then caused to react in the chamber to form water vapor. The formed water vapor is used to oxidize the substrate. In an embodiment of the present invention a combined partial pressure of the oxygen containing gas and the hydrogen containing gas in the reaction chamber is developed between 1–50 Torr to enhance the oxidation rate of silicon by the water vapor.

BRIEF DESCRIPTION OF THE DRAWINGS

FIG. 5 is a graph which illustrates the detonation pressure created for various $O_2/H_2$ concentration ratios having a partial pressure of 150 torr.

DETAILED DESCRIPTION OF THE PRESENT INVENTION

Figure 1:
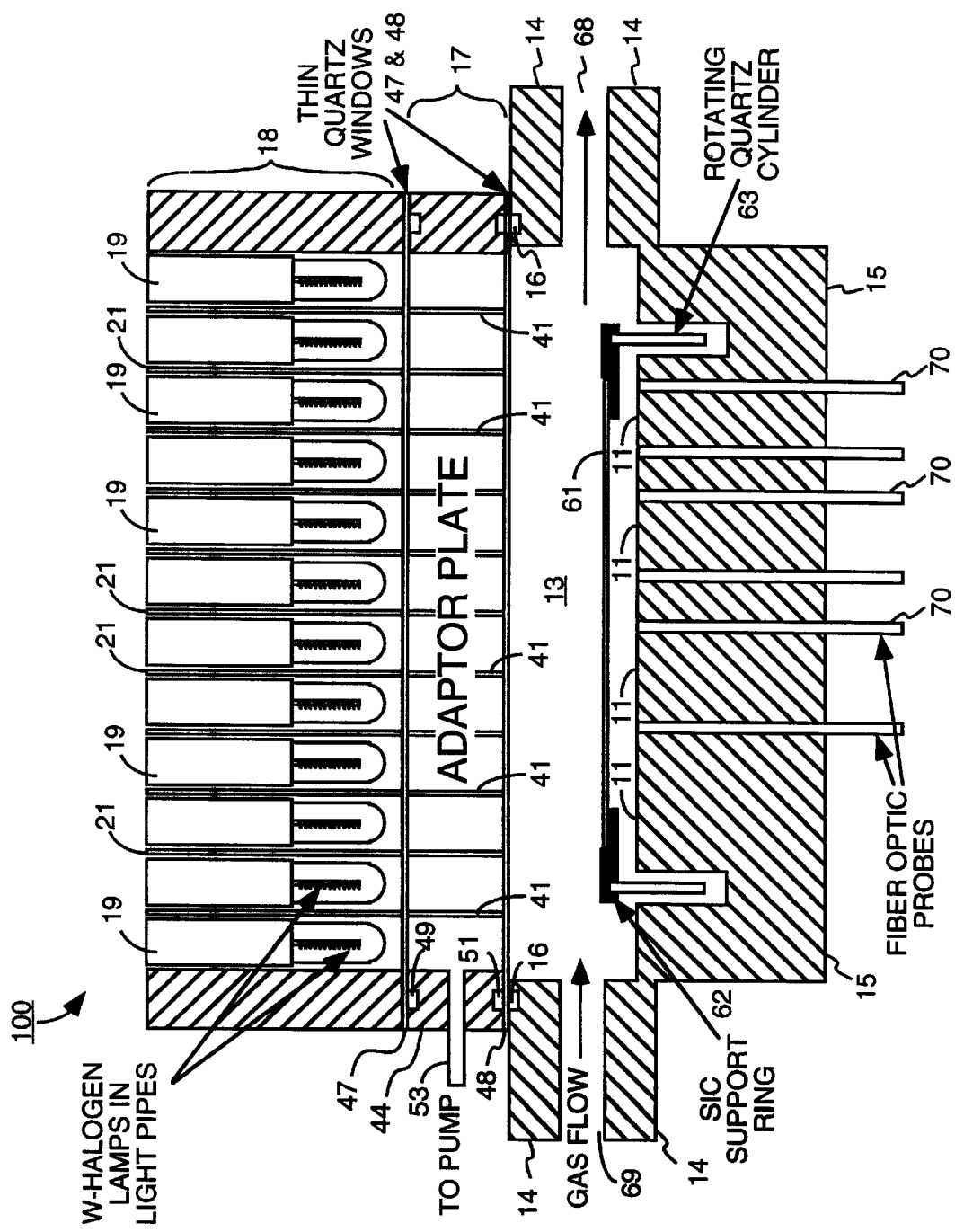
FIG. 1 is an illustration of a rapid thermal heating apparatus which can implement the insitu moisture generation oxidation process of the present invention.

The present invention describes a novel method and apparatus for insitu moisture generation in a rapid thermal steam oxidation process. In the following description numerous specific details such as apparatus configurations as well as process specifics such as time and temperature are set forth in order to provide a thorough understanding of the present invention. One skilled in the art will appreciate the ability to use alternative configurations and process details to the disclosed specifics without departing from the scope of the present invention. In other instances well known semiconductor processing equipment and techniques have not been described in detail in order to not unnecessarily obscure the present invention.

The present invention describes a steam oxidation process. According to the present invention, steam ($H_2O$) is formed in the same chamber as which the substrate to be oxidized is located (i.e., steam is formed insitu with the substrate). According to the present invention a reactant gas mixture comprising a hydrogen containing gas, such as but not limited to $H_2$ and $NH_3$ and an oxygen containing gas, such as but not limited to $O_2$ and $N_2O$, is fed into a reaction chamber in which a substrate is located. The oxygen containing gas and the hydrogen containing gas are caused to react to form moisture or steam ($H_2O$) in the reaction chamber. The reaction of the hydrogen containing gas and the oxygen containing gas is ignited or catalyzed by heating the wafer to a temperature sufficient to cause the moisture reaction. Because the heated wafer is used as the ignition source for the reaction, the moisture generation reaction occurs in close proximity to the wafer surface. Reactant gas concentrations and partial pressures are controlled so as to prevent spontaneous combustion within the chamber. By keeping the chamber partial pressure of the reactant gas mixture at less than or equal to 150 torr during the reaction, any reactant gas concentration may be utilized to form moisture without causing spontaneous combustion. The insitu moisture generation process of the present invention preferably occurs in a reduced pressure single wafer chamber of a rapid thermal processor. A rapid thermal steam oxidation process utilizing insitu moisture generation is ideally suited for oxidizing a silicon film or substrate in the formation of modern ultra high density integrated circuits.

The insitu moisture generation process of the present invention is preferably carried out in a rapid thermal heating apparatus, such as but not limited to, the Applied Materials, Inc. RTP Centura with a Honeycomb Source. Another suitable rapid thermal heating apparatus and its method of operation is set forth in U.S. Pat. No. 5,155,336 assigned to the Assignee of the present application. Additionally, although the insitu moisture generation reaction of the present invention is preferably carried out in a rapid thermal heating apparatus, other types of thermal reactors may be utilized such as the Epi or Poly Centura single wafer "cold wall" reactor by Applied Materials used to form high temperature films (HTF) such as epitaxial silicon, polysilicon, oxides and nitrides.

Figure 2:
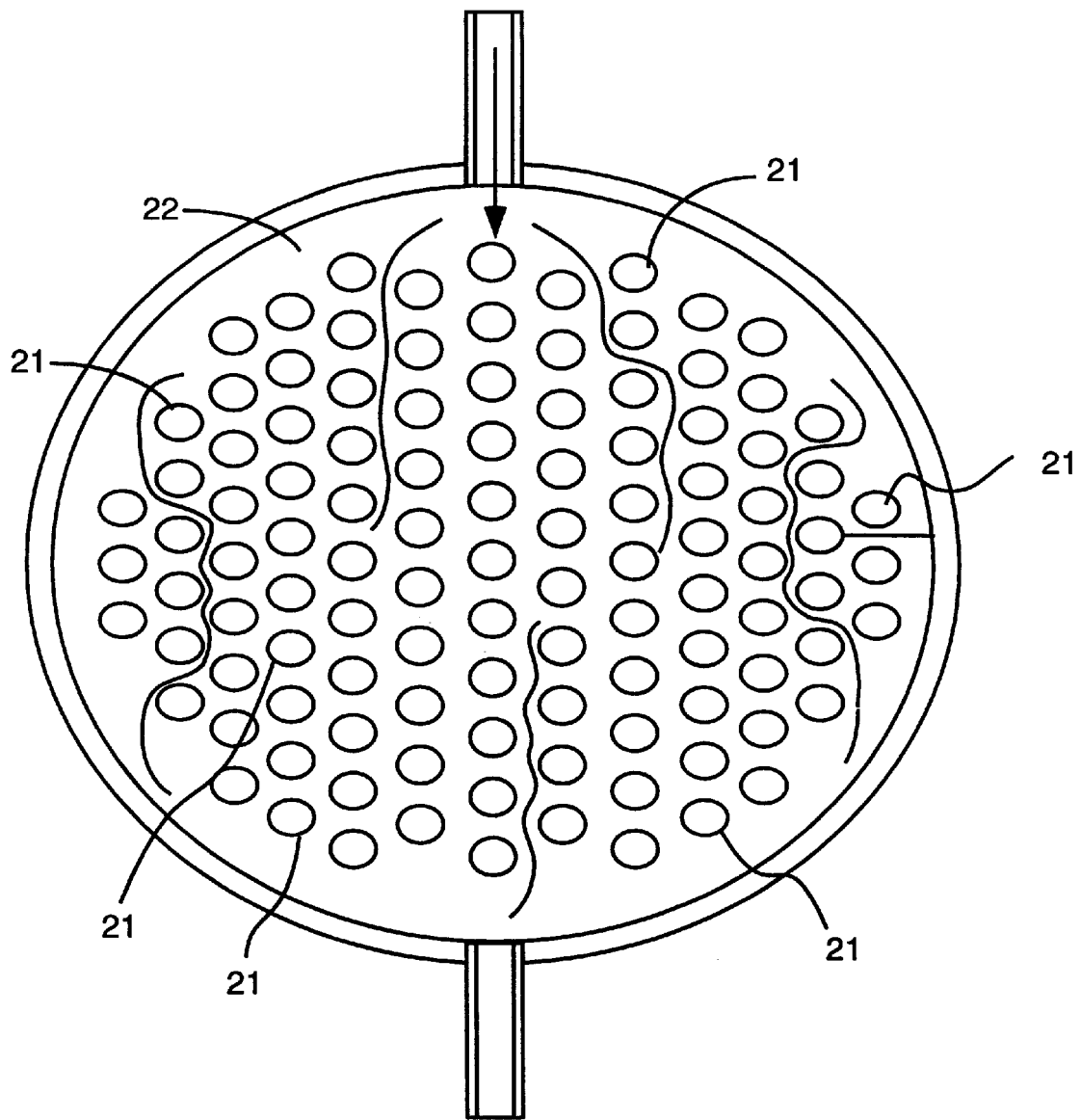
FIG. 2 is an illustration of the light source placement in the rapid thermal heating apparatus of FIG. 1.

FIGS. 1 and 2 illustrate a rapid thermal heating apparatus 100 which can be used to carry out the insitu moisture oxidation process of the present invention. Rapid thermal heating apparatus 100, as shown in FIG. 1, includes an evacuated process chamber 13 enclosed by a sidewall 14 and a bottom wall 15. Sidewall 14 and bottom wall 15 are preferably made of stainless steel. The upper portion of sidewall 14 of chamber 13 is sealed to window assembly 17 by "O" rings 16. A radiant energy light pipe assembly 18 is positioned over and coupled to window assembly 17. The radiant energy assembly 18 includes a plurality of tungsten halogen lamps 19, for example Sylvania EYT lamps, each mounted into a light pipe 21 which can be a stainless steel, brass, aluminum or other metal.

A substrate or wafer 61 is supported on its edge in side chamber 13 by a support ring 62 made up of silicon carbide. Support ring 62 is mounted on a rotatable quartz cylinder 63. By rotating quartz cylinder 63 support ring 62 and wafer 61 can be caused to rotate. An additional silicon carbide adapter ring can be used to allow wafers of different diameters to be processed (e.g., 150 mm as well as 200 mm). The outside edge of support ring 62 preferably extends less than two inches from the outside diameter of wafer 61. The volume of chamber 13 is approximately two liters.

The bottom wall 15 of apparatus 100 includes a gold coated top surface 11 for reflecting energy onto the backside of wafer 61. Additionally, rapid thermal heating apparatus 100 includes a plurality of fiber optic probes 70 positioned through the bottom wall 15 of apparatus 100 in order to detect the temperature of wafer 61 at a plurality of locations across its bottom surface. Reflections between the backside of the silicon wafer 61 and reflecting surface 11 create a blackbody cavity which makes temperature measurement independent of wafer backside emissivity and thereby provides accurate temperature measurement capability.

Rapid thermal heating apparatus 100 includes a gas inlet 69 formed through sidewall 14 for injecting process gas into chamber 13 to allow various processing steps to be carried out in chamber 13. Coupled to gas inlet 69 is a source, such as a tank, of oxygen containing gas such as $O_2$ and a source, such as a tank, of hydrogen containing gas such as $H_2$. Positioned on the opposite side of gas inlet 69, in sidewall 14, is a gas outlet 68. Gas outlet 68 is coupled to a vacuum source, such as a pump, to exhaust process gas from chamber 13 and to reduce the pressure in chamber 13. The vacuum source maintains a desired pressure while process gas is continually fed into the chamber during processing.

Lamps 19 include a filament wound as a coil with its axis parallel to that of the lamp envelope. Most of the light is emitted perpendicular to the axis towards the wall of the surrounding light pipe. The light pipe length is selected to at least be as long as the associated lamp. It may be longer provided that the power reaching the wafer is not substantially attenuated by increased reflection. Light assembly 18 preferably includes 187 lamps positioned in a hexagonal array or in a "honeycomb shape" as illustrated in FIG. 2. Lamps 19 are positioned to adequately cover the entire surface area of wafer 61 and support ring 62. Lamps 19 are grouped in zones which can be independently controlled to provide for extremely uniform heating of wafer 61. Heat pipes 21 can be cooled by flowing a coolant, such as water, between the various heat pipes. The radiant energy source 18 comprising the plurality of light pipes 21 and associated lamps 19 allows the use of thin quartz windows to provide an optical port for heating a substrate within the evacuative process chamber.

Window assembly 17 includes a plurality of short light pipes 41 which are brazed to upper/lower flange plates which have their outer edges sealed to an outer wall 44. A coolant, such as water, can be injected into the space between light pipes 41 to serve to cool light pipes 41 and flanges. Light pipes 41 register with light pipes 21 of the illuminator. The water cooled flange with the light pipe pattern which registers with the lamp housing is sandwiched between two quartz plates 47 and 48. These plates are sealed to the flange with "O" rings 49 and 51 near the periphery of the flange. The upper and lower flange plates include grooves which provide communication between the light pipes. A vacuum can be produced in the plurality of light pipes 41 by pumping through a tube 53 connected to one of the light pipes 41 which in turn is connected to the rest of the pipes by a very small recess or groove in the face of the flange. Thus, when the sandwiched structure is placed on a vacuum chamber 13 the metal flange, which is typically stainless steel and which has excellent mechanical strength, provides adequate structural support. The lower quartz window 48, the one actually sealing the vacuum chamber 13, experiences little or no pressure differential because of the vacuum on each side and thus can be made very thin. The adapter plate concept of window assembly 17 allows quartz windows to be easily changed for cleaning or analysis. In addition, the vacuum between the quartz windows 47 and 48 of the window assembly provides an extra level of protection against toxic gasses escaping from the reaction chamber.

Rapid thermal heating apparatus 100 is a single wafer reaction chamber capable of ramping the temperature of a wafer 61 or substrate at a rate of 25–100° C./sec. Rapid thermal heating apparatus 100 is said to be a "cold wall" reaction chamber because the temperature of the wafer during the oxidation process is at least 400° C. greater than the temperature of chamber sidewalls 14. Heating/cooling fluid can be circulated through sidewalls 14 and/or bottom wall 15 to maintain walls at a desired temperature. For a steam oxidation process utilizing the insitu moisture generation of the present invention, chamber walls 14 and 15 are maintained at a temperature greater than room temperature (23° C.) in order to prevent condensation. Rapid thermal heating apparatus 100 is preferably configured as part of a "cluster tool" which includes a load lock and a transfer chamber with a robotic arm.

Figure 3:
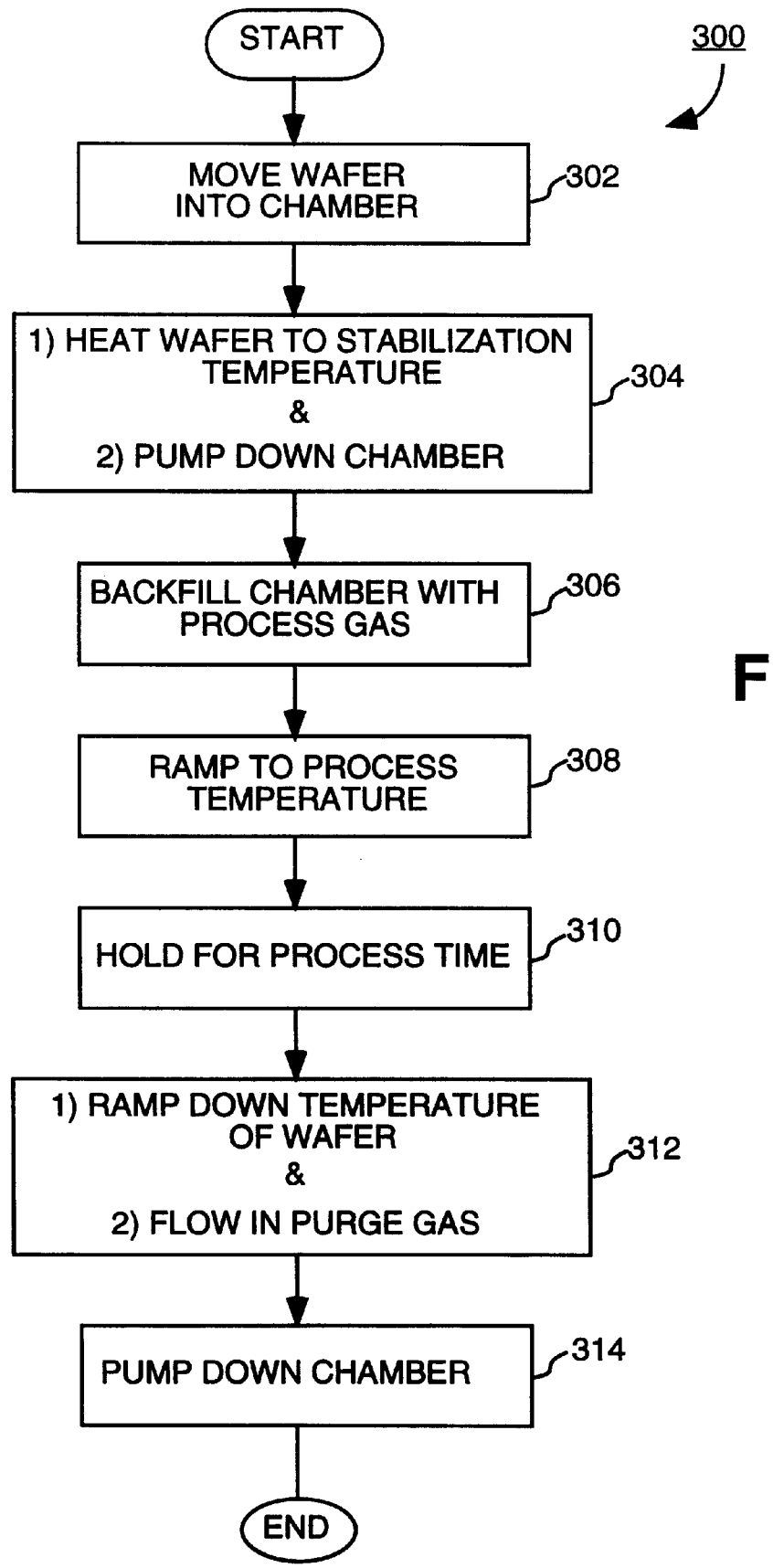
FIG. 3 is a flow chart which illustrates a rapid thermal oxidation process which utilizes the insitu moisture generation process of the present invention.
Figure 4A:
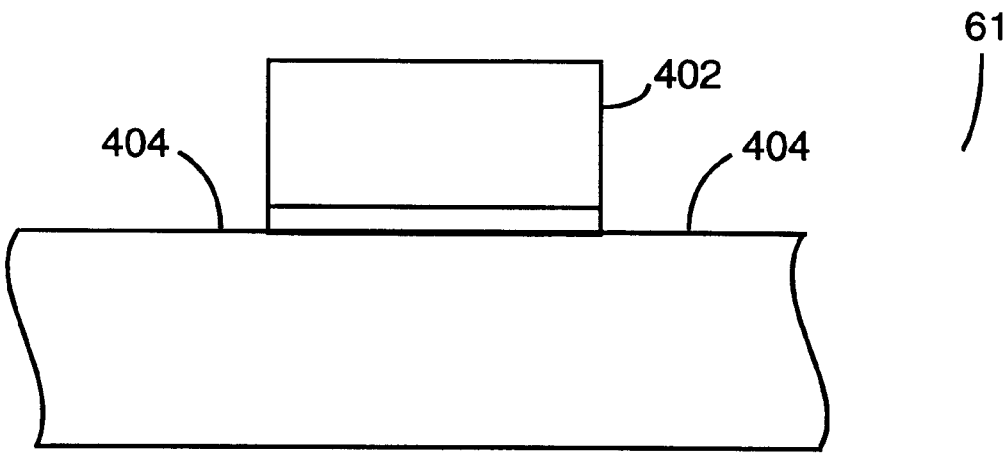
FIG. 4a is a cross sectional view of a semiconductor wafer or substrate prior to steam oxidation.

A method of insitu generation of moisture or steam in a rapid thermal oxidation process according to the present invention is illustrated in flow chart 300 of FIG. 3. The method of the present invention will be described with respect to an insitu moisture generation process in the rapid thermal heating apparatus illustrated in FIGS. 1 and 2. Additionally, the oxidation process of the present invention will be described with respect to the steam oxidation or passivation of a silicon gate electrode 402 and a silicon substrate surface 404 of a silicon wafer 61 as shown in FIG. 4a. It is to be appreciated that the insitu moisture generation oxidation process of the present invention can be used to oxidize any form of silicon including epitaxial, amorphous, or polycrystalline, including doped and undoped forms. Additionally the process can be used to passivate or oxidize other device or circuit features including but not limited to emitter and capacitor electrodes, interconnects and trenches, as well as be used to form gate dielectric layers.

The first step according to the present invention, as set forth in block 302, is to move a wafer or substrate, such as wafer 61 into vacuum chamber 13. As is typical with modern cluster tools, wafer 61 will be transferred by a robot arm from a load lock through a transfer chamber and placed face up onto silicon carbide support ring 62 located in chamber 13 as shown in FIG. 1. Wafer 61 will generally be transferred into vacuum chamber 13 having a nitrogen ($N_2$) ambient at a transfer pressure of approximately 20 torr. Chamber 13 is then sealed.

Next, as set forth in block 304, the pressure in chamber 13 is further reduced by evacuating the nitrogen ($N_2$) ambient through gas outlet 70. Chamber 13 is evacuated to a pressure to sufficiently remove the nitrogen ambient. Chamber 13 is pumped down to a prereaction pressure less than the pressure at which the insitu moisture generation is to occur, and is preferably pumped down to a pressure of less than 1 torr.

Simultaneous with the prereaction pump down, power is applied to lamps 19 which in turn irradiate wafer 61 and silicon carbide support ring 62 and thereby heat wafer 61 and support ring 62 to a stabilization temperature. The stabilization temperature of wafer 61 is less than the temperature (reaction temperature) required to initiate the reaction of the hydrogen containing gas and oxygen containing gas to be utilized for the insitu moisture generation. The stabilization temperature in the preferred embodiment of the present invention is approximately 500° C.

Once the stabilization temperature and the prereaction pressure are reached, chamber 13 is backfilled with the desired mixture of process gas. The process gas includes a reactant gas mixture comprising two reactant gasses: a hydrogen containing gas and an oxygen containing gas, which can be reacted together to form water vapor ($H_2O$) at temperatures between 400–1250° C. The hydrogen containing gas, is preferably hydrogen gas ($H_2$), but may be other hydrogen containing gasses such as, but not limited to, ammonia ($NH_3$), deuterium (heavy hydrogen) and hydrocarbons such as methane ($CH_4$). The oxygen containing gas is preferably oxygen gas ($O_2$) but may be other types of oxygen containing gases such as but not limited to nitrous oxide ($N_2O$). Other gasses, such as but not limited to nitrogen ($N_2$), may be included in the process gas mix if desired. The oxygen containing gas and the hydrogen containing gas are preferably mixed together in chamber 13 to form the reactant gas mixture.

In the present invention the partial pressure of the reactant gas mixture (i.e., the combined partial pressure of the hydrogen containing gas and the oxygen containing gas) is controlled to ensure safe reaction conditions. According to the present invention, chamber 13 is backfilled with process gas such that the partial pressure of the reactant gas mixture is less than the partial pressure at which spontaneous combustion of the entire volume of the desired concentration ratio of reactant gas will not produce a detonation pressure wave of a predetermined amount. The predetermined amount is the amount of pressure that chamber 13 can reliably handle without failing. FIG. 5 is a graph which shows detonation pressures for different reactant gas mixtures of $O_2$ and $H_2$ at a partial pressure of 150 torr for the spontaneous combustion of the entire volume, about 2 liters, of chamber 13 at a process temperature of 950° C. According to the present invention, insitu moisture generation is preferably carried out in a reaction chamber that can reliably handle a detonation pressure wave of four atmospheres or more without affecting its integrity. In such a case, reactant gas concentrations and operating partial pressure preferably do not provide a detonation wave greater than two atmospheres for the spontaneous combustion of the entire volume of the chamber.

By controlling the chamber partial pressure of the reactant gas mixture in the present invention any concentration ratio of hydrogen containing gas and oxygen containing gas can be used including hydrogen rich mixtures utilizing H2/O2 ratios greater than 2:1, respectively, and oxygen rich mixtures using $H_2/O_2$ ratios less than 0.5:1, respectively. For example, FIG. 5 shows that any concentration ratio of $O_2$ and $H_2$ can be safely used as long as the chamber partial pressure of the reactant gasses is maintained at less than 150 torrs at process temperature. The ability to use any concentration ratio of oxygen containing gas and hydrogen containing gas enables one to produce an ambient with any desired concentration ratio of $H_2/H_2O$ or any concentration ratio of $O_2/H_2O$ desired. Whether the ambient is oxygen rich or dilute steam or hydrogen rich or dilute steam can greatly affect device electrical characteristics. The present invention enables a wide variety of different steam ambients to be produced and therefore a wide variety of different oxidation processes to be implemented.

In some oxidation processes, an ambient having a low steam concentration with the balance $O_2$ may be desired. Such an ambient can be formed by utilizing a reactant gas mixture comprising 10% $H_2$ and 90% $O_2$. In other processes, an ambient of hydrogen rich steam (70–80% $H_2$/30–20% $H_2O$) may be desired. A hydrogen rich, low steam concentration ambient can be produced according to the present invention by utilizing a reactive gas mix comprising between 5–20% $O_2$ with the remainder $H_2$ (95–80%). It is to be appreciated that in the present invention any ratio of hydrogen containing gas and oxygen containing gas may be utilized because the heated wafer provides a continual ignition source to drive the reaction. Unlike pyrogenic torch methods, the present invention is not restricted to specific gas ratios necessary to keep a stable flame burning.

Next, as set forth in block 308, power to lamps 19 is increased so as to ramp up the temperature of wafer 61 to process temperature. Wafer 61 is preferably ramped from the stabilization temperature to process temperature at a rate of between 10–100° C./sec with 50° C./sec being preferred. The preferred process temperature of the present invention is between 600–1150° C. with 950° C. being preferred. The process temperature must be at least the reaction temperature (i.e., must be at least the temperature at which the reaction between the oxygen containing gas and the hydrogen containing gas can be initiated by wafer 61) which is typically at least 600° C. It is to be noted that the actual reaction temperature depends upon the partial pressure of the reactant gas mixture as well as on the concentration ratio of the reactant gas mixture, and can be between 400° C. to 1250° C.

As the temperature of wafer 61 is ramped up to process temperature, it passes through the reaction temperature and causes the reaction of the hydrogen containing gas and the oxygen containing gas to form moisture or steam ($H_2O$). Since rapid thermal heating apparatus 100 is a "cold wall" reactor, the only sufficiently hot surfaces in chamber 13 to initiate the reaction is the wafer 61 and support ring 62. As such, in the present invention the moisture generating reaction occurs near, about 1 cm from, the surface of wafer 61. In the present invention the moisture generating reaction is confined to within about two inches of the wafer, or about the amount at which support ring 62 extends past the outside edge of wafer 61. Since it is the temperature of the wafer (and support ring) which initiates or turns "on" the moisture generation reaction, the reaction is said to be thermally controlled by the temperature of wafer 61 (and support ring 62). Additionally, the vapor generation reaction of the present invention is said to be "surface catalyzed" because the heated surface of the wafer is necessary for the reaction to occur, however, it is not consumed in the reaction which forms the water vapor.

Figure 4B:
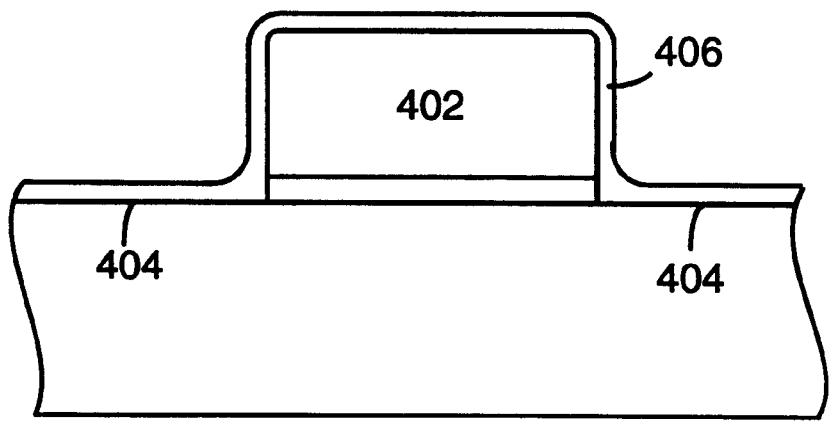
FIG. 4b is an illustration of a cross sectional view showing the formation of an oxide on the substrate of FIG. 4a by a rapid thermal oxidation process which utilizes insitu moisture generation of the present invention.

Next, as set forth in block 310, once the desired process temperature has been reached, the temperature of wafer 61 is held constant for a sufficient period of time to enable the water vapor generated from the reaction of the hydrogen containing gas and the oxygen containing gas to oxidize silicon surfaces or films to form $SiO_2$. Wafer 61 will typically be held at process temperature for between 30–120 seconds. Process time and temperature are generally dictated by the thickness of the oxide film desired, the purpose of the oxidation, and the type and concentrations of the process gasses. FIG. 4b illustrates an oxide 406 formed on wafer 61 by oxidation of silicon surfaces 402 and 404 by water vapor ($H_2O$) generated by the insitu moisture generation process of the present invention. It is to be appreciated that the process temperature must be sufficient to enable the reaction of the generated water vapor or steam with silicon surfaces to form silicon dioxide.

Next, as set forth in block 312, power to lamps 19 is reduced or turned off to reduce the temperature of wafer 61. The temperature of wafer 61 decreases (ramps down) as fast as it is able to cool down (at about 50° C./sec.). Simultaneously, $N_2$ purge gas is fed into the chamber 13. The moisture generation reaction ceases when wafer 61 and support ring 62 drop below the reaction temperature. Again it is the wafer temperature (and support ring) which dictates when the moisture reaction is turned "on" or "off".

Next, as set forth in block 314, chamber 13 is pumped down, preferably below 1 torr, to ensure that no residual oxygen containing gas and hydrogen containing gas are present in chamber 13. The chamber is then backfilled with $N_2$ gas to the desired transfer pressure of approximately 20 torr and wafer 61 transferred out of chamber 13 to complete the process. At this time a new wafer may be transferred into chamber 13 and the process set forth in flow chart 300 repeated.

At times it may be desirable to utilize concentration ratios of hydrogen containing gas and oxygen containing gas which will produce an ambient with a large concentration of water vapor (e.g., >40% $H_2O$). Such an ambient can be formed with a reactant gas mixture, for example, comprising 40–80% $H_2$/60–20% $O_2$. A gas mixture near the stoichiometric ratio may yield too much combustible material to enable safe reaction conditions. In such a situation, a low concentration gas mixture (e.g., less than 15% $O_2$ in $H_2$) can be provided into the reaction chamber during step 306, the wafer temperature raised to the reaction temperature in step 308, and the reaction initiated with the lower concentration ratio. Once the reaction has been initiated and the existing reactant gas volume begins to deplete, the concentration ratio can be increased to the desired level. In this way, the amount of fuel available at the start of the reaction is kept small and safe operating conditions assured.

In an embodiment of the present invention a relatively low, reactive gas partial pressure is used for insitu steam generation in order to obtain enhanced oxidation rates. It has been found that providing a partial pressure of between 1 Torr to 50 Torr of hydrogen gas ($H_2$) and oxygen gas ($O_2$) that an enhanced oxide growth rate of silicon can be achieved. That is, for a given set of process conditions (i.e., $H_2/O_2$ concentration ratio, temperature, and flow rate) the oxidation rate of silicon is actually higher for lower partial pressures (1–50 Torr) of $H_2$ and $O_2$ than for higher partial pressures (i.e., from 50 Torr to 100 Torr).

Figure 6:
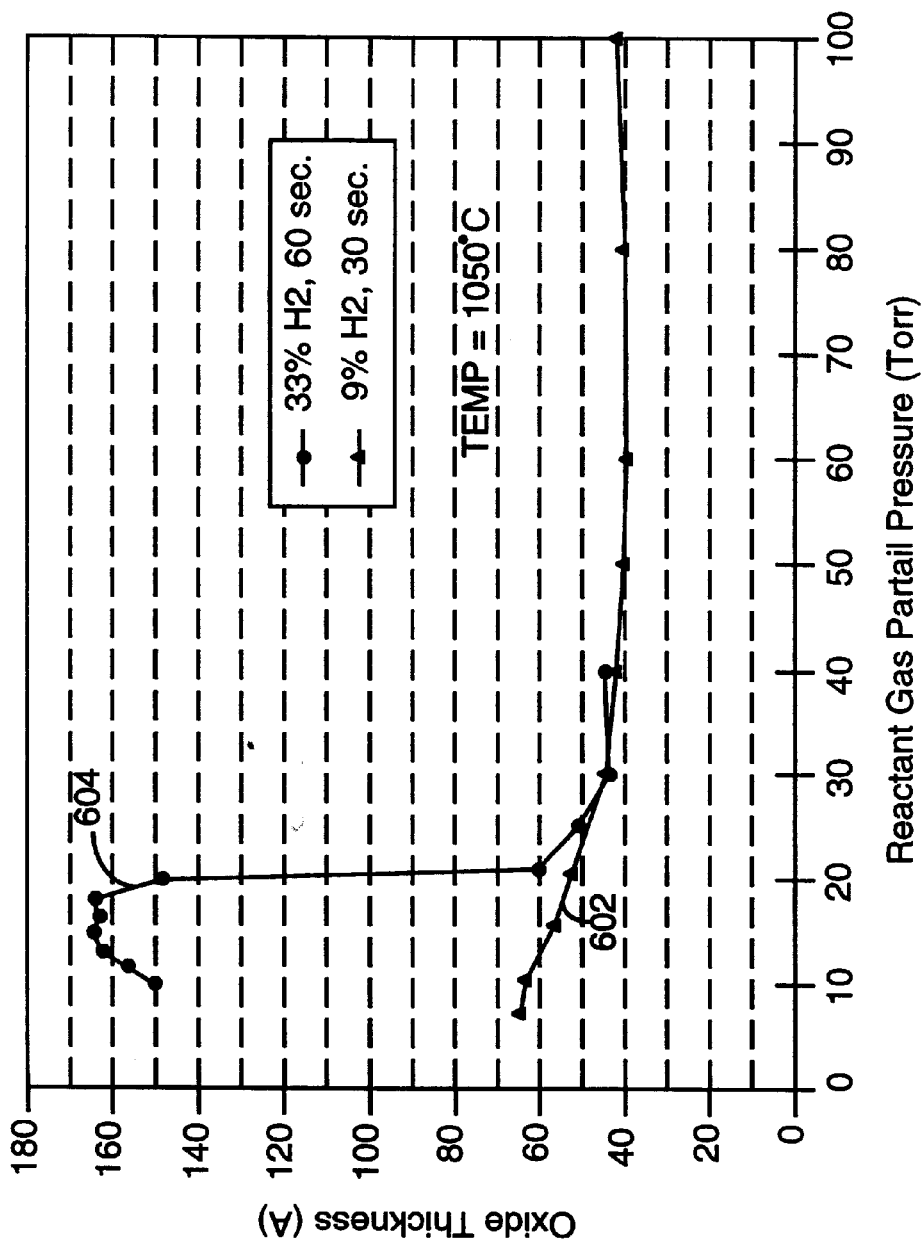
FIG. 6 illustrates plots which depict oxide thickness versus reactant gas partial pressure for different $H_2/O_2$ concentrations.

The plots of FIG. 6 illustrate how reactant gas partial pressures can enhance the oxidation rate of silicon. Plot 602 depicts different oxide thicknesses that are formed for different reactant gas partial pressures for an ambient created by reacting 9% $H_2$ with 91% $O_2$ at 1050° C. for 30 seconds. Plot 604 depicts different oxide thicknesses that are formed for different reactant gas partial pressures for an ambient created by reacting 33% $H_2$ with 66% $O_2$ at 1050° C. for 60 seconds.

As is apparent from the graphs of FIG. 6, as the reactant gas partial pressure of $H_2$ and $O_2$ is incrementally decreased from atmospheric pressure to about 50 Torr for 9% $H_2$, and to about 30 Torr for 33% $H_2$, the oxidation rate of silicon also decreases incrementally. A decrease in oxidation rate for silicon with a decrease in reactant gas partial pressure is expected in that one would expect when less $O_2$ and $H_2$ are available for the generation of steam the oxidation rate would decrease. When a reactant gas partial pressure of less than or equal to approximately 50 Torr for 9% $H_2$ and 30 Torr for 33% $H_2$ obtained, however, the oxidation rate quite unexpectedly begins to increase with incremental decreases in reactant gas partial pressure. The oxidation rate continues to increase until a maximum enhanced oxidation rate is reached at approximately 8–12 Torr at which point the oxidation rate begins to decrease for incremental decreases in reactant gas partial pressure. Although the oxidation rate begins to decrease after the maximum enhanced oxidation rate achieved at 8–12 Torr, it still provides an enhanced oxidation rate (i.e., provides an oxidation rate greater than the oxidation rate generated at approximately 50 Torr (9% $H_2$) and 30 Torr (33% $H_2$)) until a reactant gas partial pressure of approximately 1–3 Torr at which point the oxidation rate enhancement falls off.

In the enhanced oxidation embodiment of the present invention, the insitu steam generation is carried out at a reactant gas partial pressure of oxygen containing gas and hydrogen containing gas where enhanced oxidation occurs. That is, in an embodiment of the present invention insitu steam generation occurs at a maximum reactant gas partial pressure of oxygen gas ($O_2$) and hydrogen gas ($H_2$) which is less than or equal to the reactant gas partial pressure at which a decrease in reactant gas partial pressure for a given set of process parameters causes an increase in the oxidation rate of silicon. Additionally in the enhanced oxidation embodiment of the present invention the minimum reactant gas partial pressure is that at which the oxidation rate is greater than or equal to the oxidation rate at the maximum reactant gas partial pressure. The minimum reactant gas partial pressure is generally about 1–3 Torr. Enhanced oxidation of silicon by a steam ambient can be created by reacting $H_2$ and $O_2$ between a minimum reactant gas partial pressure of between 1–3 Torr and a maximum reactant gas partial pressure of about 50 Torr. In another embodiment of the present invention insitu steam generation is carried out at a combined oxygen containing gas and hydrogen containing gas partial pressure of between 5–15 Torr which is where the peak enhanced oxidation rate occurs.

It is to be appreciated that operating the insitu steam generation process of the present invention at a reactant gas partial pressure at which enhanced oxidation occurs is valuable for a number of reasons. An increase in oxidation rate means less oxidation time is required to grow an oxide of a given thickness which increases throughput which thereby decreases the cost of ownership of a tool. Such increases in wafer throughput are extremely important when single wafer reactors such as rapid thermal heating apparatus 100 are utilized. Additionally short oxidation times reduce the thermal budget of semiconductor chips, which improves their performance and reliability. Additionally, an increase in oxidation rate enables the insitu steam generation process of the present invention to be used for the generation of thick oxides (e.g., oxides greater than 100 Å).

Still further operating at low reactant gas partial pressures not only provides the advantage of enhanced oxidation rate but also provides the advantage of safe operating conditions in that the detonation pressure created by the spontaneous combustion of the entire volume of the chamber is minimized due to the small amount of fuel available. Additionally, operating at low partial pressures prevents the condensation of moisture inside a "cold wall" chamber which prevents the introduction of an uncontrolled reactant.

Figure 7:
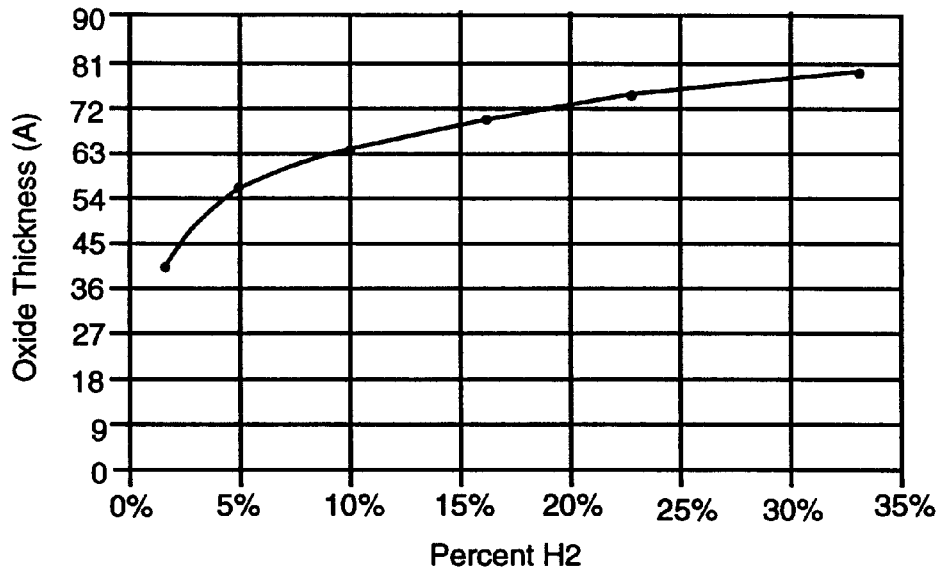
FIG. 7 is a plot which illustrates oxide thickness versus $H_2/O_2$ reactant gas concentration ratios.

Although the oxidation rate of only two concentration ratios of $H_2/O_2$ are illustrated in FIG. 6, the oxidation rate of other concentration ratios between 2% $H_2$/98% $O_2$ to 66% $H_2$/33% $O_2$ behave similarly. It has been found that when operating at reactant gas partial pressures where enhanced oxidation occurs, that the oxidation rate of silicon is influenced by the concentration ratio of the hydrogen containing gas and the oxygen containing gas. For example, FIG. 7 illustrates different oxidation thicknesses for different concentration ratios of $H_2$ and $O_2$ for a given set of process parameters (i.e., $O_2$ flow 10 SLM, reactant gas partial pressure 10 Torr, temperature 1050° C., and time 30 seconds). As illustrated in FIG. 7, the greatest increase in oxidation rate occurs between 1–5% $H_2$ while after 33% $H_2$ the oxidation rate stabilizes at about 150 Å per minute.

Figure 8:
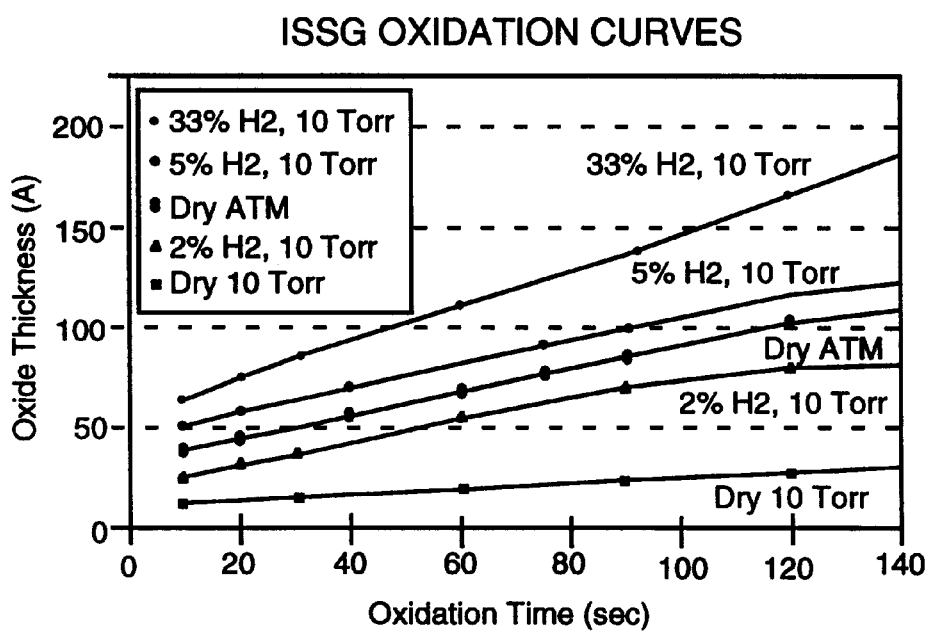
FIG. 8 illustrate plots which depict oxide thickness versus oxidation time for various concentration ratios and reactant gas partial pressures.

FIG. 8 illustrates how oxide thickness varies for oxidation time for different insitu steam oxidation processes (33% $H_2$/66% $O_2$; 5% $H_2$/95% $O_2$; 2% $H_2$/98% $O_2$; or at 10 Torr) and different dry oxidation processes (100% $O_2$ at 10 Torr and 100% $O_2$ at atmospheric). As illustrated in FIG. 8, reduced pressure steam oxidation processes provide for increased oxidation rates over dry oxidation processes at the same pressure. Additionally, insitu steam generated oxidation processes with a $H_2$ concentration greater than 3% provide higher oxidation rates than do dry oxidation processes at all oxidation pressures including atmospheric pressure.

In an embodiment of the present invention, a concentration ratio between 2% $H_2$/98% $O_2$ to 33% $H_2$/66% $O_2$ is utilized because such produces a sufficient oxidation rate but yet utilizes a low concentration of reactant gas which makes the process safe. It is to be appreciated that when concentration ratios are closer to the stoichiometric ratio (66% $H_2$/33% $O_2$) there is the potential for the entire volume of the chamber to spontaneously combust. By operating in the concentration range of between 2%–33% $H_2$, one is able to obtain oxidation rates near the oxidation rate of the stoichiometric ratio but without the danger of the spontaneous combustion of the entire volume since only a small percentage of $H_2$ is available for reaction. It has been found that by operating with a concentration ratio of 33% $H_2$/66% $O_2$, a good oxidation rate can be obtained while providing a sufficiently low concentration of $H_2$ to ensure safe operating conditions.

Figure 9:
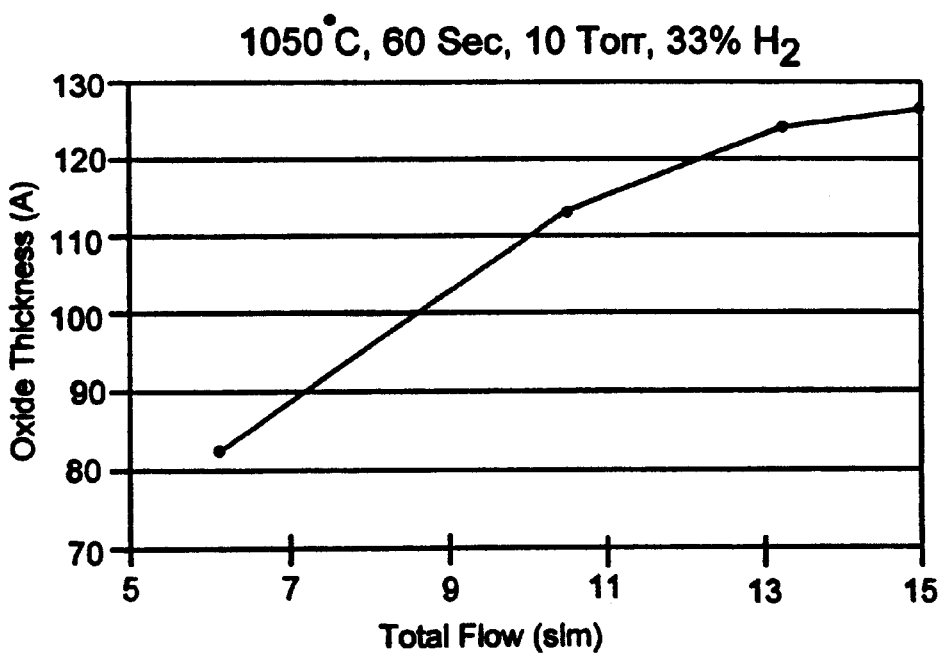
FIG. 9 is a plot which illustrates oxide thickness versus total flow of process gas.

When operating at oxidation pressures which obtain enhanced silicon oxidation rates, the oxidation rate is strongly influenced by the total flow rate of the oxygen containing gas and the hydrogen containing gas. For example, FIG. 9 illustrates how the oxidation rate of silicon varies for the total flow rate of a 33% $H_2$/66% $O_2$ reactant gas mix at a reactant gas partial pressure of 10 Torr and a temperature of 1050° C. in rapid thermal processing apparatus 100, having a chamber volume of approximately 2 liters. As shown in FIG. 9, when operating at low reactant gas partial pressures, in order to generate enhanced oxidation rates, an increase in the total flow increases the oxidation rate. As shown in FIG. 9 the oxidation rate increases dramatically for an increase in total flow when the total flow is less than 10 SLM and increases, but less dramatically, for increases in total flow above 10 SLM.

Accordingly, when operating at a partial pressure to provide enhanced oxidation, the oxidation rate of silicon can be said to be "mass transport rate" limited. That is, the oxidation rate is limited by the amount of reactant gas fed into the chamber. The fact that the insitu steam oxidation process of the present invention can be "mass transport rate" limited is quite unexpected in that the present invention utilizes relatively large reactant gas flow rates (greater than 5 SLM into a 2 liter chamber) At such high flow rates one would expect there to be sufficient reactants available to make the oxidation rate independent of the mass transport rate. It is to be appreciated that silicon oxidation processes are generally thought to be "surface reaction rate" limited where the temperature controls the oxidation rate and not the flow rate of the reactant gases.

Although the present invention has been described with respect to the insitu generation of a vapor of a specific reactive species, water, it is to be appreciated that the teachings of the present invention can be applied to other processes where the temperature of a wafer is used to initiate or catalyze the reaction of reactant gasses to form a vapor of a reactive species near the wafer surface. The reactive species vapor can then be reacted with the wafer or with films formed thereon to carry out processes such as film growth. For example, the insitu vapor generation process of the present invention can be utilized to convert a silicon dioxide ($SiO_2$) film into a robust silicon-oxy-nitride film. For example, a reactant gas mixture comprising ammonia (NH$_3$) and oxygen (O$_2$) can be fed into a chamber and then caused to react by heating a wafer to a sufficient temperature to initiate a reaction of the gasses to form nitric oxide (NO) in vapor form. The nitric oxide vapor can then be caused to react with an oxide film formed on the wafer to form a silicon-oxy-nitride film. Silicon-oxy-nitride films have been found to provide robust gate dielectric layers at thicknesses less than 100 Å. Other applications for the insitu vapor generation process of the present invention will be evident to those skilled in the art.

Thus, a novel method and apparatus for the insitu generation of steam in a rapid thermal oxidation process has been described.

We claim:

1. A method of forming an oxide, said method comprising the steps of:

placing the substrate in a chamber;

providing an oxygen containing gas into said chamber;

providing a hydrogen containing gas into said chamber;

generating a partial pressure of said oxygen containing gas and said hydrogen containing gas in said chamber;

reacting said oxygen containing gas with said hydrogen containing gas in said chamber near the surface of said substrate to form an ambient;

oxidizing said substrate with said ambient; and wherein said partial pressure is less than or equal to the partial pressure at which a decrease in said partial pressure causes an increase in the oxidation rate of said substrate by said ambient.

2. A method of forming an oxide, said method comprising the steps of:

placing the substrate in a chamber;

providing an oxygen containing gas into said chamber;

providing a hydrogen containing gas into said chamber;

generating a partial pressure of said oxygen containing gas and said hydrogen containing gas in said chamber;

reacting said oxygen containing gas with said hydrogen containing gas in said chamber near the surface of said substrate to form an ambient;

oxidizing said substrate with said ambient; and wherein at said partial pressure an incremental decrease in partial pressure results in an increase in oxidation rate of said substrate by said ambient.

3. A method of forming an oxide, said method comprising the steps of:

placing the substrate in a chamber;

providing an oxygen containing gas into said chamber;

providing a hydrogen containing gas into said chamber; and generating an oxygen containing gas and hydrogen containing gas partial pressure and concentration ratio such that the oxidation rate of said substrate by an ambient created by reacting said oxygen containing gas and said hydrogen containing gas is greater than the oxidation rate of said substrate by an ambient created by reacting said concentration ratio of said hydrogen containing gas and said oxygen containing gas at a 100 Torr partial pressure of said oxygen containing gas and said hydrogen containing gas.

4. A method of forming an oxide, said method comprising the steps of:

placing a substrate in a chamber;

providing a flow of oxygen containing gas and hydrogen containing gas into said chamber;

generating a partial pressure of said oxygen containing gas and said hydrogen containing gas;

reacting said oxygen containing gas with said hydrogen containing gas in said chamber near the surface of said substrate to form an ambient;

oxidizing said substrate with said ambient; and wherein at said partial pressure the oxidation rate of silicon is "mass transport rate" limited.

* * * * *